United States Patent

Wang et al.

[11] Patent Number: 5,971,772
[45] Date of Patent: Oct. 26, 1999

[54] LOW PROFILE CLAMPING MECHANISM FOR CONNECTING A PRINTED CIRCUIT BOARD TO A FLEXIBLE PRINTED CIRCUIT

[75] Inventors: Terry Shing Wang, Irvine; John Steven Szalay, Corona Del Mar; Everett Lacy Benze, Aliso Viejo, all of Calif.

[73] Assignee: Packard Hughes Interconnect Company, Irvine, Calif.

[21] Appl. No.: 09/026,074

[22] Filed: Feb. 19, 1998

[51] Int. Cl.[6] ....................................................... H01R 9/07
[52] U.S. Cl. ................................................................. 439/67
[58] Field of Search ........................................ 439/67, 493

[56] References Cited

U.S. PATENT DOCUMENTS 4,420,206  12/1983  Martyniak ................................ 439/368

OTHER PUBLICATIONS

IBM Technical Disclosure Bulletin, vol. 28, No. 11, pp. 4989, Apr. 1986.

*Primary Examiner*—Neil Abrams
*Attorney, Agent, or Firm*—Cary W. Brooks; Patrick M. Griffin

[57] ABSTRACT

A clamping mechanism (10) for connecting a printed circuit board (12) having a plurality of electrically conductive pads (14) to a flexible printed circuit having a plurality of electrically conductive raised dots (18). A housing (20) having a mouth (22) is located upon the printed circuit board at the plurality of pads. A pair of L-shaped leaf springs (28, 28') are connected with the housing. A cam body (40) having a rounded cam surface (42), an opposite grasping lever (44), and a pair of opposing first and second flat surfaces (46, 48) therebetween is rotatably connected to the leaf springs. A first stiffener (58) is attached to the flexible printed circuit opposite the raised dots thereof which is configured to alignably fit with the shape of the mouth of the housing to thereby align the raised dots with the pads. A second stiffener (54) is provided at the printed circuit board opposite the housing.

18 Claims, 2 Drawing Sheets

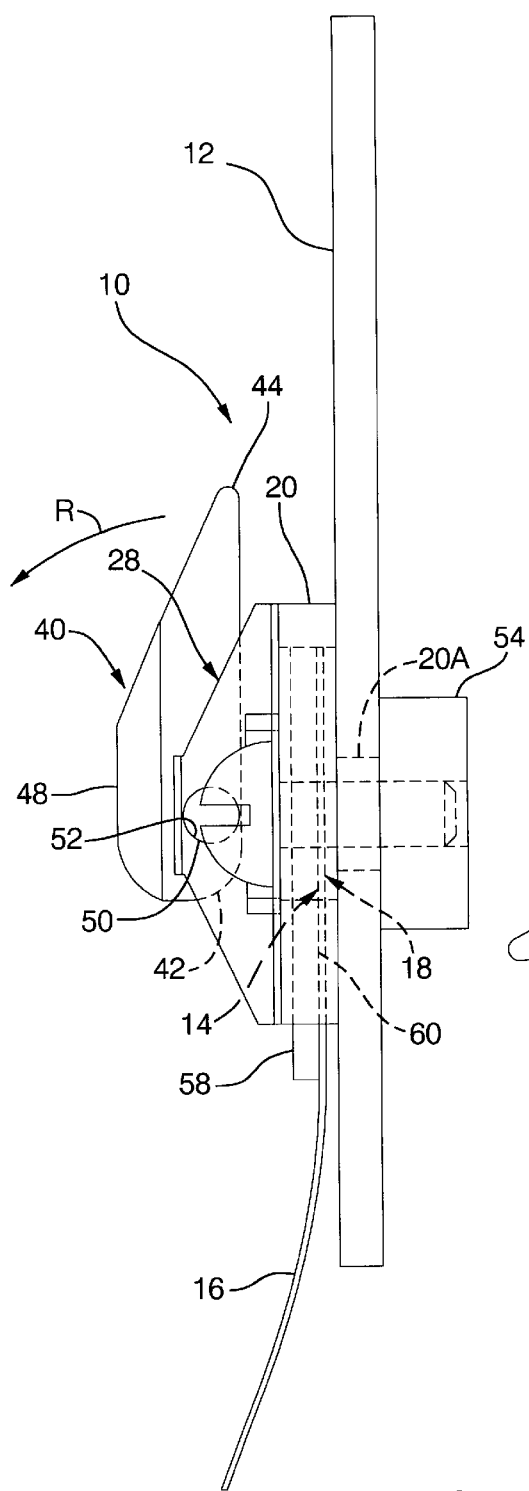
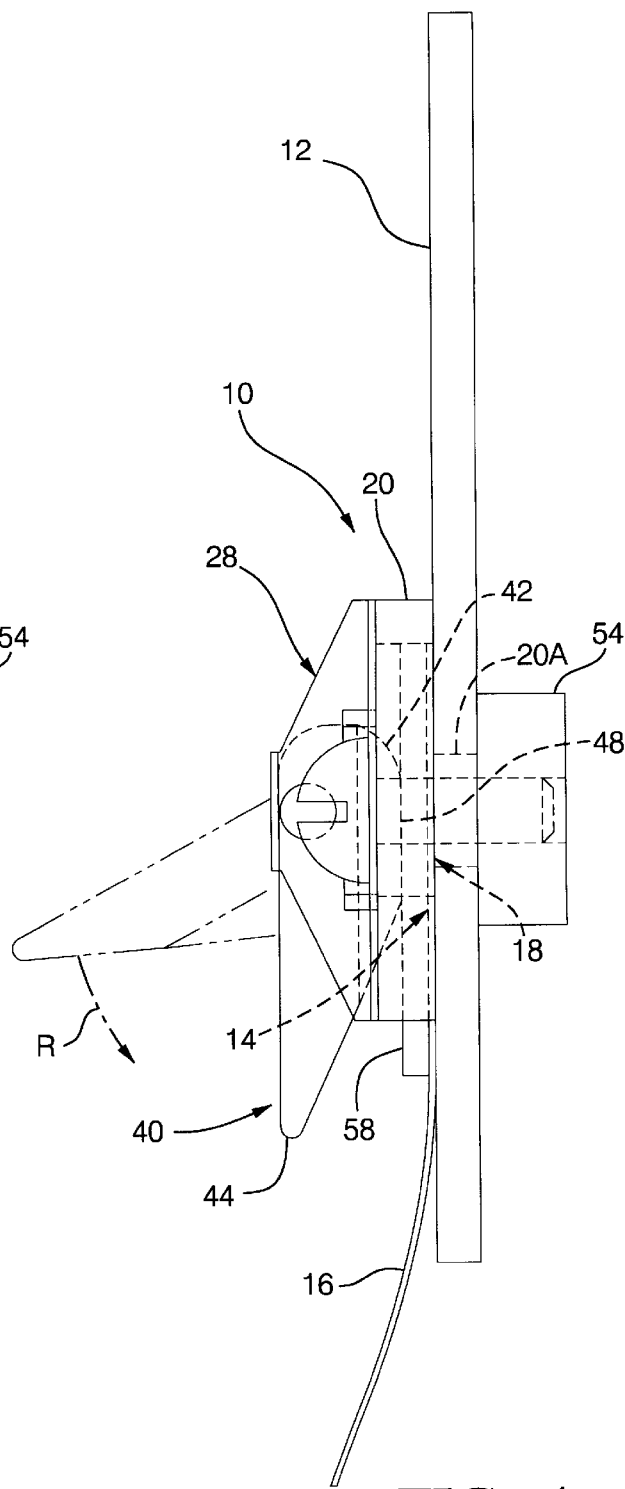
FIG. 3
FIG. 4

LOW PROFILE CLAMPING MECHANISM FOR CONNECTING A PRINTED CIRCUIT BOARD TO A FLEXIBLE PRINTED CIRCUIT

TECHNICAL FIELD

The present invention relates to connections for printed circuit boards with respect to flexible printed circuits. More particularly, the present invention relates to a clamping mechanism having a cam lever which cooperates with leaf springs to provide a very low profiled, quick and easy connection/disconnection of a flexible printed circuit with respect to a printed circuit board.

BACKGROUND OF THE INVENTION

Printed circuit boards have become ubiquitous in electronic devices for providing a compact and reliable base for electronic components. Printed circuit boards are generally formed of a rigid dielectric layer having a plurality of holes for receiving leads of electronic components, and on one side of the dielectric layer, a predetermined pattern of an electrical conductor (typically copper) for being soldered to the leads and conduct current as desired. It is also known to provide printed circuits which have a flexible dielectric layer, known a flexible printed circuit.

In order to function as a part of an electrical circuit of a device, printed circuit boards and flexible printed circuits must often be electrically connected together. Typically, this is accomplished via electrical connectors.

It is known to provide electrical connection between printed circuit boards and flexible printed circuits using mutual abutment of electrically conductive raised dots and pads. In this regard, the mutual touching of raised dots and pads provides an excellent alternative to electrical connectors. However, it is important that the raised dots and the pads be mutually aligned and be in tight contact with each other, respectively.

Accordingly, what remains needed in the art is a structure which effects tight contact between the raised dots and pads, yet has a very low profile and is easily operated.

SUMMARY OF THE INVENTION

The present invention is a clamping mechanism for mechanically and electrically connecting a printed circuit board to a flexible printed circuit, wherein the clamping mechanism has a very low profile and is easily operated.

The clamping mechanism according to the present invention interfaces with a printed circuit board having an electrically conductive area in the form of a plurality of pads and a flexible printed circuit having a raised electrically conductive area in the form of a plurality of raised dots. A housing is located upon the printed circuit board such that a mouth of the housing is located at the plurality of pads. A pair of L-shaped leaf springs are provided, each having a base portion and an upright portion. One leaf spring is located at each end of the housing, respectively, wherein the housing and the leaf springs are attached to the printed circuit board by fasteners, such as for example threaded fasteners or rivets. The upright portion of each of the leaf springs has a pivot hole formed therein. A cam body is provided, having a rounded cam surface, an opposite grasping lever, and a pair of opposing first and second flat surfaces therebetween. The cam body further has a pair of pivot pins projecting from each end thereof which are received by the pivot holes of the upright portion of the leaf springs, whereby the cam body is rotatably mounted to the leaf springs.

A flexible printed circuit stiffener is attached, such as for example by an adhesive, to the flexible printed circuit opposite the raised dots thereof. The flexible printed circuit stiffener is configured to alignably fit with the shape of the mouth of the housing to thereby align the plurality of raised dots with the plurality of pads. A printed circuit board stiffener is provided at the printed circuit board opposite the housing via the threaded fasteners.

In operation of the clamping mechanism according to the present invention, the cam body is in its unclamped state, whereat the first flat surface is adjacent the printed circuit board and the mouth of the housing is clear of the cam body. The flexible printed circuit stiffener is placed alignably into the mouth of the housing, whereupon the plurality of raised dots align with the plurality of pads. The cam body is grasped at the lever and rotated on the pivot pins so that the cam surface contacts the flexible printed circuit stiffener and then presses thereagainst as the cam body is further rotated until the second flat surface thereabuts. At this clamped state of the cam body, the plurality of raised dots and the plurality of pads are in tight, electrically good, contact.

Accordingly, it is an object of the present invention to provide a clamping mechanism for mechanically and electrically connecting a printed circuit board to a flexible printed circuit, wherein the clamping mechanism has a very low profile and is easily operated.

These, and additional objects, advantages, features and benefits of the present invention will become apparent from the following specification.

BRIEF DESCRIPTION OF THE DRAWINGS

FIG. 3 is an end view of the clamping mechanism according to the present invention, shown in an unclamped state.

FIG. 4 is an end view of the clamping mechanism according to the present invention, shown in the clamped state.

DESCRIPTION OF THE PREFERRED EMBODIMENT

Figure 1:
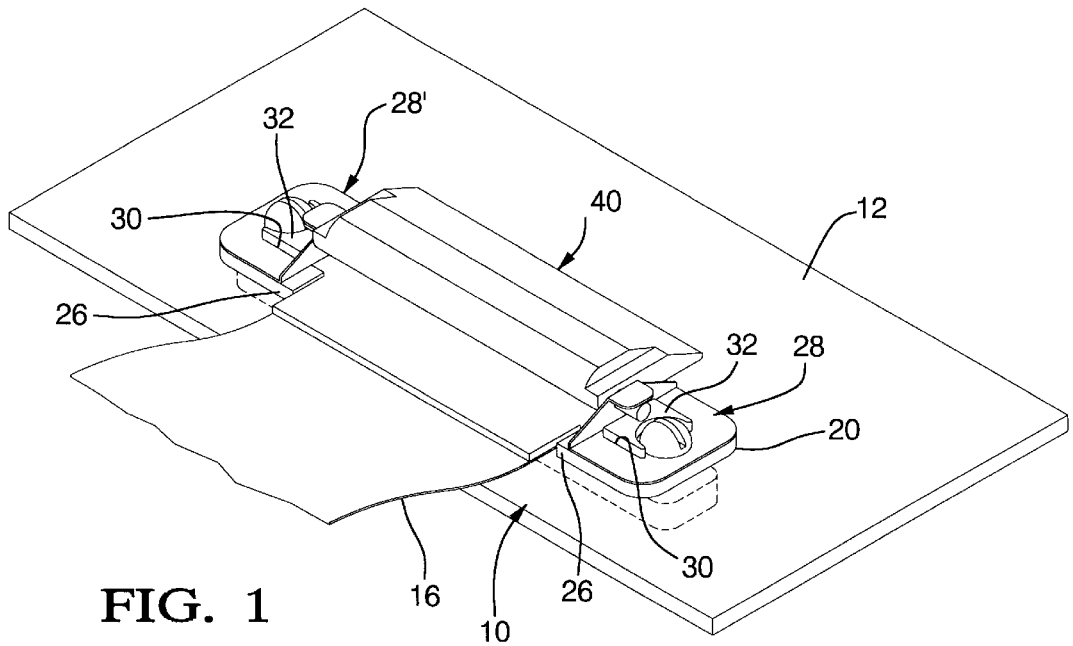
FIG. 1 is a perspective view of the clamping mechanism according to the present invention, shown in a clamped state connecting a printed circuit board to a flexible printed circuit.
Figure 2:
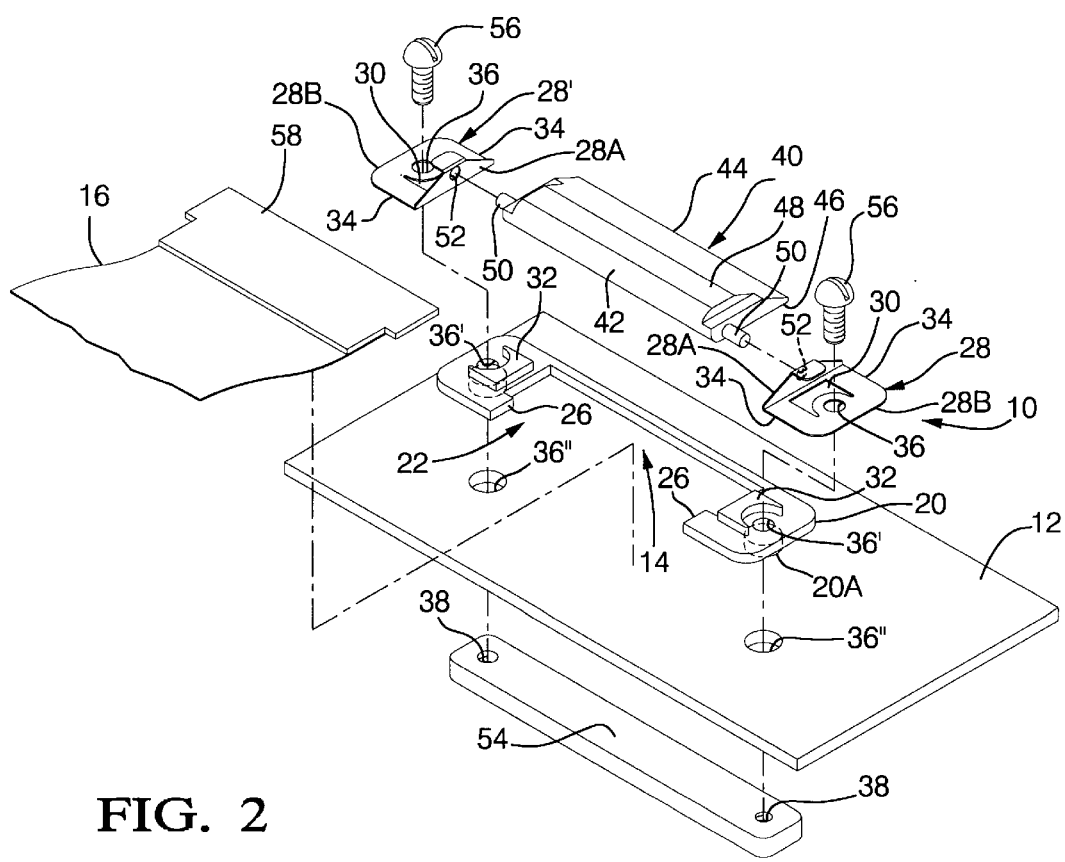
FIG. 2 is an exploded view of the clamping mechanism according to the present invention.

Referring now to the Drawings, the clamping mechanism 10 according to the present invention mechanically and electrically connects a printed circuit board 12 having a first electrically conductive area 14 in the form of pads to a flexible printed circuit 16 having a raised second electrically conductive area 18 in the form of a plurality of raised dots. In this regard, the plurality of pads is forced into tight and aligned contact with the plurality of raised dots.

A housing 20 is located on the printed circuit board 12. The housing 20 is preferably composed of a dielectric plastic material and has a generally rectilinearly shaped mouth 22. The mouth opening 24 has a pair of opposing tabs 26. The mouth 22 is dimensioned to fit over and leave exposed the first electrically conductive area 14 when the housing 20 is located on the printed circuit board 12.

A pair of L-shaped leaf springs 28, 28', preferably composed of a beryllium-copper alloy, is provided, wherein each leaf spring has a base portion 28B and an upright portion 28A. The leaf springs 28, 28' are located at opposing ends, respectively, of the housing 20. In this regard, it is preferred for the base portion 28b to have a cut-out 30 which alignably receives a reciprocally shaped raised boss 32 of the housing 20. The cut-out 30 at the base portion 28b results in a pair of spaced spring arms 34 which connect the base portion with the upright portion 28A.

A cam body 40 is provided which is preferably composed of a dielectric plastic, and includes a rounded cam surface 42, a grasping lever 44 opposite the cam surface, and a pair of opposing first and second flat surfaces 46, 48 which abut the cam surface. At opposing ends of the cam body 40 a pivot pin 50 projects therefrom. Each of the upright portions 28A have a pivot hole 52 formed therein which is structured for receiving therethrough a respective pivot pin 50.

A hole 36 is provided in each base portion 28b, and a hole 36' is provided in each end of the housing 20. Further, a hole 36" is provided at two preselected locations in the printed circuit board 12. An annular boss 20A circumscribes each of the holes 36' of the housing 20. Each annular boss 20A inserts into a respective hole 36" of the printed circuit board 12 (see FIGS. 3 and 4) to thereby align the housing to the printed circuit board. A printed circuit board stiffener 54, such as for example a stiff plastic piece, abuts the printed circuit board 12 opposite the first electrically conductive area 14. The printed circuit board stiffener 54 has a pair of threaded holes 38 which align with the two holes 36" in the printed circuit board 12.

To install the components of the clamping mechanism 10 which are directly associated with the printed circuit board 12, the following steps are undertaken. The housing 20 is placed upon the printed circuit board 12 such that the first electrically conductive area 14 is exposed and located inside the mouth 22. The two base portions 28b set upon respective ends of the housing 20 so that the respective boss 32 thereof is received into the cut-out 30, while simultaneously the pivot pins 50 are received into the respective pivot holes 52. Next, a threaded fastener 56 passes through, respectively, the aligned holes 36, 36', 36" of a base portion 28B, an end of the housing 20 and the printed circuit board 12, and then threadably engages a respective threaded hole 38 of the printed circuit board stiffener 54. Alternatively, other types of fasteners may be used, such as for example rivets.

Opposite the second electrically conductive area 18 of the flexible printed circuit 16, a flexible printed circuit stiffener 58 is provided. The flexible printed circuit stiffener 58 is preferably a stiff plastic that is accurately laminated to the flexible printed circuit 16. Preferably, a thin elastomeric layer 60 is provided between the flexible printed circuit 16 and the flexible printed circuit stiffener 58.

In order for the first electrically conductive area 14 to align accurately with the second electrically conductive area 18, the flexible printed circuit stiffener 58 is configured to snugly fit into the mouth 22 of the housing 20. In this regard, when the flexible printed circuit stiffener 58 is placed into the mouth 22, the tabs 26 abut the flexible printed circuit stiffener so that it cannot slide thereout (in other words, the flexible printed circuit stiffener must be vertically lifted up from, or placed down upon, the printed circuit board at the mouth).

In operation of the clamping mechanism 10, the cam body 40 is initially rotated to its unclamped state, whereat the first flat surface 46 is adjacent the printed circuit board 12 and the mouth 22 of the housing 20 is clear of the cam body. The flexible printed circuit stiffener 58 is placed alignably into the mouth of the housing, whereupon the first electrically conductive area 14 faces toward and contacts the second electrically conductive area 18, ie., the plurality of raised dots align with respect to the plurality of pads. The cam body is grasped at the lever 44 and rotated on the pivot pins 50.

Upon the cam surface 42 contacting the flexible printed circuit stiffener 58, the cam body presses together the first and second electrically conductive areas 14, 18 with increasing force as it is rotated to the clamped state. This pressure occurs because: 1) the pivot pins 50 are located closer to the plane of the first flat surface 46 than to the plane of the second flat surface 48, yet the center of curvature of the cam surface 42 is midway between the planes of the first and second flat surfaces; and 2) the arms 34 at the base 28b of the leafs springs 28 are caused to resiliently bend in response to the cam body rotating after the cam surface has contacted the flexible printed circuit stiffener.

When the second flat surface abuts the flexible printed circuit, the clamped state of the cam body is reached whereat the leaf springs resiliently press the cam body against the flexible printed circuit stiffener. This pressure causes the plurality of raised dots and the plurality of pads to be in tight, electrically good, contact with each other.

To those skilled in the art to which this invention appertains, the above described preferred embodiments may be subject to change or modification. Such change or modification can be carried out without departing from the scope of the invention, which is intended to be limited only by the scope of the appended claims.

We claim:

1. A clamping mechanism for clamping a printed circuit board to a flexible printed circuit, comprising:
   a cam body having a first end and an opposite second end, said cam body having a rounded cam surface between said first and second ends;
   a first leaf spring rotatably connected to said first end of said cam body;
   a second leaf spring rotatably connected to said second end of said cam body; and
   connection means for connecting said first and second leaf springs to a printed circuit board;
   wherein rotation of said cam body from said unclamped state to said clamped state results in said cam surface becoming decreasingly spaced with respect to a selected location on the printed circuit board.

2. The clamping mechanism of claim 1, wherein said cam body comprises:
   a first flat surface;
   a second flat surface located opposite said first flat surface, wherein said first and second flat surfaces abut said cam surface; and
   a lever located opposite said cam surface;
   wherein when said cam body is at said clamped state, said second flat surface faces toward the printed circuit board at an orientation substantially parallel thereto.

3. The clamping mechanism of claim 2, wherein each of said first and second leaf springs comprise:
   a base portion interfaced with said connection means; and
   an upright portion oriented at substantially ninety degrees to said base portion;
   wherein said cam body is rotatably connected to said upright portion of each leaf spring at a pivot location that is located closer to a first plane defined by said first flat surface than to a second plane defined by said second flat surface.

4. The clamping mechanism of claim 3, further comprising:

a housing having a mouth;

means for connecting said housing to the printed circuit board; and first stiffener means connectable with a flexible printed circuit for providing rigidification of a selected portion of the flexible printed circuit, wherein said first stiffener means is shaped to cooperate with said mouth to align the flexible printed circuit with the printed circuit board when said first stiffener means is received in said mouth.

5. The clamping mechanism of claim 4, wherein said housing has a raised boss, respectively, at each of said first and second ends thereof; and wherein said base portion of each leaf spring has a cut-out, wherein the cut-out of each base portion receives therein a respective raised boss of said housing.

6. The clamping mechanism of claim 5, wherein the cut-out of each said base portion forms a pair of resilient arms.

7. The clamping mechanism of claim 6, further comprising second stiffener means connectable to the printed circuit board opposite said first and second biasing members for providing rigidification of the printed circuit board.

8. The clamping mechanism of claim 7, wherein said cam body comprises:

a first flat surface;

a second flat surface located opposite said first flat surface, wherein said first and second flat surfaces abut said cam surface; and a lever located opposite said cam surface;

wherein when said cam body is at said clamped state, said second flat surface faces toward the printed circuit board at an orientation substantially parallel thereto.

9. A clamping mechanism for clamping a printed circuit board to a flexible printed circuit, comprising:

a printed circuit board having a first electrically conductive area;

a flexible printed circuit having a raised second electrically conductive area;

a cam body having a first end and an opposite second end, said cam body having a rounded cam surface between said first and second ends;

a housing connected to said printed circuit board, said housing having a first end and an opposite second end, said housing having a mouth between said first and second ends;

a first leaf spring connected to said first end of said housing, said first end of said cam body being rotatably connected to said first leaf spring; and a second leaf spring connected to said second end of said housing, said second end of said cam body being rotatably connected to said second leaf spring;

wherein rotation of said cam body from said unclamped state to said clamped state results in said cam surface becoming decreasingly spaced with respect to said first electrically conductive area of said printed circuit board.

10. The clamping mechanism of claim 9, wherein said cam body comprises:

a first flat surface;

a second flat surface located opposite said first flat surface, wherein said first and second flat surfaces abut said cam surface; and a lever located opposite said cam surface;

wherein when said cam body is at said clamped state, said second flat surface faces toward the printed circuit board at an orientation substantially parallel thereto.

11. The clamping mechanism of claim 10, wherein each of said first and second leaf springs comprise:

a base portion connected to said housing; and an upright portion oriented at substantially ninety degrees to said base portion;

wherein said cam body is rotatably connected to said upright portion of each leaf spring at a pivot location that is located closer to a first plane defined by said first flat surface than to a second plane defined by said second flat surface.

12. The clamping mechanism of claim 11, further comprising a first stiffener connected with said flexible printed circuit opposite said second electrically conductive area, wherein said first stiffener is shaped to cooperate with said mouth to align the second electrically conductive area with said first electrically conductive area when said first stiffener is received in said mouth.

13. The clamping mechanism of claim 12, wherein said housing has a raised boss, respectively, at each of said first and second ends thereof; and wherein said base portion of each leaf spring has a cut-out, wherein the cut-out of each base portion receives therein a respective raised boss of said housing.

14. The clamping mechanism of claim 13, wherein the cut-out of each said base portion forms a pair of resilient arms.

15. The clamping mechanism of claim 14, wherein said second electrically conductive area comprises a plurality of raised gold dots.

16. The clamping system of claim 15, further comprising an elastomeric layer between said flexible printed circuit and said first stiffener.

17. The clamping mechanism of claim 16, further comprising a second stiffener connected to said printed circuit board opposite said first electrically conductive area.

18. The clamping mechanism of claim 17, wherein said cam body comprises:

a first flat surface;

a second flat surface located opposite said first flat surface, wherein said first and second flat surfaces abut said cam surface; and a lever located opposite said cam surface;

wherein when said cam body is at said clamped state, said second flat surface faces toward the printed circuit board at an orientation substantially parallel thereto.

* * * * *